(12) United States Patent
Parrill et al.

(10) Patent No.: US 7,750,322 B2
(45) Date of Patent: Jul. 6, 2010

(54) ION IMPLANTER FOR PHOTOVOLTAIC CELL FABRICATION

(75) Inventors: Thomas Parrill, Andover, MA (US); Aditya Agarwal, Sunnyvale, CA (US)

(73) Assignee: Twin Creeks Technologies, Inc., San Jose, CA (US)

( * ) Notice: Subject to any disclaimer, the term of this patent is extended or adjusted under 35 U.S.C. 154(b) by 0 days.

(21) Appl. No.: 12/418,237

(22) Filed: Apr. 3, 2009

(65) Prior Publication Data
US 2009/0283705 A1 Nov. 19, 2009

Related U.S. Application Data

(63) Continuation of application No. 12/122,108, filed on May 16, 2008, now Pat. No. 7,687,786.

(51) Int. Cl.
*H01J 37/317* (2006.01)
*H01J 37/30* (2006.01)
*H01L 21/265* (2006.01)

(52) U.S. Cl. ............... 250/492.21; 250/492.2; 250/423 R; 250/281; 250/282; 250/396 R; 700/121; 438/795

(58) Field of Classification Search ............ 250/492.21, 250/492.2, 423 R, 281, 282, 396 R; 700/121; 438/795
See application file for complete search history.

(56) References Cited

U.S. PATENT DOCUMENTS

| | | | |
|---|---|---|---|
| 4,163,151 A | 7/1979 | Bayless et al. | |
| 5,350,926 A | 9/1994 | White et al. | |
| 5,374,564 A | 12/1994 | Bruel | |
| 6,130,436 A * | 10/2000 | Renau et al. | 250/492.21 |
| 6,146,979 A | 11/2000 | Henley et al. | |
| 6,528,391 B1 | 3/2003 | Henley et al. | |
| 6,927,148 B2 | 8/2005 | Ito | |
| 7,687,786 B2 * | 3/2010 | Parrill et al. | 250/492.21 |
| 2008/0038908 A1 * | 2/2008 | Henley | 438/530 |
| 2009/0081848 A1 * | 3/2009 | Erokhin et al. | 438/455 |

FOREIGN PATENT DOCUMENTS

EP 0491313 B1 10/1996

OTHER PUBLICATIONS

Brendel, Rolf, "Technological Approaches to Thin-Film Cells," *Thin Film Crystalline Silicon Solar Cells: Physics and Technology*, Wiley-VCH, 2003, pp. 91-120.

Ziegler, J. F., ed., *Ion Implementation-Science and Technology*, Annapolis, MD: Ion Implantation Technology, Co., 2004, pp. ii, iv-vi, 1-1 to 1-43, 2-1 to 2-42, 3-1 to 3-30, 7-1 to 7-38, 8-1 to 8-40, 9-1 to 9-33, 11-0 to 11-28, 12-1 to 12-40, 13-1 to 13-41, and 14-1 to 14-37.

Ziegler, J. F., ed., Ion *Implementation-Science and Technology*, Poughkeepsie, NY: Ion Implantation Technology, Co., 1996, pp. ii-v, 391-464, and 465-510.

(Continued)

*Primary Examiner*—Nikita Wells
(74) *Attorney, Agent, or Firm*—Cesari and McKenna, LLP

(57) ABSTRACT

Ion implanters are especially suited to meet process dose and energy demands associated with fabricating photovoltaic devices by ion implantation followed by cleaving.

29 Claims, 6 Drawing Sheets

OTHER PUBLICATIONS

Glukhoy et al., "Characterization of a High-density Plasma Immersion Ion Implanter with Scaleable ECR Large-area Plasma Source," pp. 172-179, Surface & Coating Technology 196, 2005.

White, Nicholas R., "Moore's Law: Implications for Ion Implant Equipment—An Equipment Designer's Perspective," pp. 355-359, Proc. 11th Intl. Conf. Ion Implant Technology (ITT), 1997.

McKenna, C.M., "A Personal Historical Perspective of Ion Implantation Equipment for Semiconductor Applications," Proc. 13th Intl. Conf. Ion Implant Technology (ITT) 19 pages, 2000.

Rose, P.H., "A History of Commercial Implantation," Nuclear Instruments and Methods in Physics Research B6, pp. 1-8, North-Holland, Amsterdam, 1985.

Rose, P.H., "A History—Mainly About Ion Implantation Equipment Since 1984," Proc. 12th Intl. Conf. Ion Implant Technology (ITT) 17 pages, 1999.

Beith et al. "Advanced Implantation and Development of General Purpose Unlimited Lifetime ECRIS for Application on Implantation Devices," pp. 400-402, Caen, 14000, France, 1999.

Kato et al. "Production of Multiply Charged Ions by Utilizing Pulsed ECR Plasma," pp. 448-451, Toyama Prefectural University, 1999.

Ryding, G. "Target Chambers for Ion Implantation Using Mechanical Scanning," pp. 239-251, North-Holland, 1981.

L.S.Steen et al., "The Precision Implant 9000, A New Concept in Ion Implantation Systems," pp. 328-333, North Holland Physics Publishing Division, 1987.

Sundstrom et al., "Introducing the ULE2 Implanter," pp. 184-187, Eaton Corporation, 1999.

Graf et al., "The ULE2 Ion Source Capabilities Important to SOI Technology," pp. 308-311, Eaton Corporation, 1999.

Tokiguchi et al., "Improvements of Microwave Ion Source for 300mm-diameter SIMOX Wafer Production," pp. 296-299, Hitachi, Ltd., 1999.

L. Wegmen, "Historical Perspective and Future Trends for Ion Implantation Systems," pp. 1-6, Nuclear Instruments and Methods 189, North Holland Publishing, 1981.

Ito et al. "Microwave Ion Source for Ultra Clean Ion Implanters" pp. 558-561, Applied Materials Japan, 1999.

Hahto et al., "Multicusp Ion Source with External RF Antenna for Production of Protons," pp. 355-359, Review of Scientific Instruments, vol. 75, No. 2, Feb. 2004.

Blake, J. and Steve Richards, "The Ibis i2000 SIMOX Ion Implanter," Proc. 14th Intl. Conf. Ion Implant Technology (ITT), 2002.

Sato et al., "Introducing the ORion II NV7392 Flat Panel Ion Doping System," Proc. 14th Intl. Conf. Ion Implant Technology (ITT), 2002.

Jiang et al., "Development if a 27.12 MHz Radio Frequency Driven Ion Source with 3 mTorr Operation Pressure for Neutron Generators," Review of Scientific Instruments, vol. 76, 2005.

A. Renau, "The Beam Line Architecture of the VIISta 810 Medium Current Ion Implanter," Presented at 12th Annual Conference on Ion Implantation Technology, Report 312, Jun. 1998.

* cited by examiner

ION IMPLANTER FOR PHOTOVOLTAIC CELL FABRICATION

CROSS-REFERENCE TO RELATED APPLICATIONS

The present application is a continuation of commonly assigned U.S. patent application Ser. No. 12/122,108, which was filed on May 16, 2008 now U.S. Pat. No. 7,687,786, by Thomas Parrill for a ION IMPLANTER FOR NONCIRCULAR WAFERS and is hereby incorporated by reference.

BACKGROUND OF THE INVENTION

1. Field of the Invention

This invention relates to ion implanters for preparing semiconductor lamina, and, in particular, ion implanters used for economical production of photovoltaic cells.

2. Background Information

As the demand for electrical energy based on renewable sources increases, the implementation of photovoltaic technology has expanded dramatically in recent years. Nevertheless, a way of forming crystalline silicon bodies optimized for photovoltaic cells as remained elusive.

Crystalline silicon wafers adapted to bear photovoltaic cells are conventionally obtained by slicing a silicon ingot. This process, which typically yields a silicon wafer thicker than 150 µm, wastes a substantial amount of silicon by consuming up to 50% of the silicon body in kerf loss and delivering a much greater thickness than is needed for useful photovoltaic devices.

Thinner silicon laminae have been made by exfoliation of a film by annealing after high-dose ion implantation. The films produced this way have found application in forming silicon-on-insulator structures but are cost-prohibitive for solar cells. Also, at thicknesses well under 1 µm, the films may be so thin as to make efficient light-capturing 20 difficult. Boosting the energy of ion implant could increase the film thickness, but this adaptation would make the films even more expensive and less economical for photovoltaics.

There is, accordingly, a need for a cost-effective way to form silicon bodies optimized for photovoltaic applications.

SUMMARY OF THE INVENTION

In a first embodiment, the invention provides an ion implanter adapted to implant ions in semiconductor wafers, comprising an appliance configured to hold the wafers; an ion source configured to generate ions at a rate; a mass analyzer, having a resolving power less than ten, configured to sort the ions according to their respective mass/charge ratios and further configured to direct selected ions toward the appliance in an ion beam; and voltage apparatus configured to apply a voltage drop of at least 250 kV between the ion source and the appliance, and further configured to propel ions toward the appliance. Illustratively, the rate may enable the selected ions to constitute a current of at least 20 mA in the ion beam, while the mass analyzer is the only mass analyzer in the ion implanter.

In another embodiment, the invention provides an ion implanter adapted to implant ions in semiconductor wafers, comprising an appliance configured to hold the wafers; an ion source configured to generate ions of a particular species, being hydrogen or helium, at a rate; voltage apparatus applying a voltage drop between the ion source and the appliance, configured to accelerate ions toward the appliance, the voltage drop comprising an extraction voltage drop, not adjustable above a maximum extraction value, configured to extract ions from the ion source; and a mass analyzer, configured to sort ions extracted from the ion source according to their respective mass/charge ratios and further configured to direct selected ions of the particular species toward the appliance in an ion beam, the mass analyzer having a maximum magnetic rigidity corresponding to selecting ions of the particular species having respective energies corresponding to the maximum extraction value. Illustratively, the rate enables the selected ions of the particular species to constitute a current of at least 20 mA in the ion beam.

In another embodiment, the invention provides a method of making a photovoltaic device, comprising providing a semiconductor wafer; configuring an appliance to hold the wafer; configuring an ion source to generate ions of a first species, being hydrogen or helium; configuring a first mass analyzer to sort ions from the ion source according to their respective mass/charge ratios and to direct selected ions toward the appliance in an ion beam; a voltage apparatus to apply a voltage drop between the ion source and the appliance; installing the semiconductor wafer in the appliance; operating the ion source, mass analyzer and voltage apparatus to generate, select, and accelerate ions of the first species toward the appliance in a first ion beam, the selected ions of the first species constituting a first current of at least 20 mA in the first ion beam, thereby implanting the ions of the first species in the wafer at a depth defining a cleave plane; and annealing the wafer to effect cleaving of a lamina from the wafer at the cleave plane, the lamina being at least 2 µm thick and suitable for fabricating a photovoltaic device

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
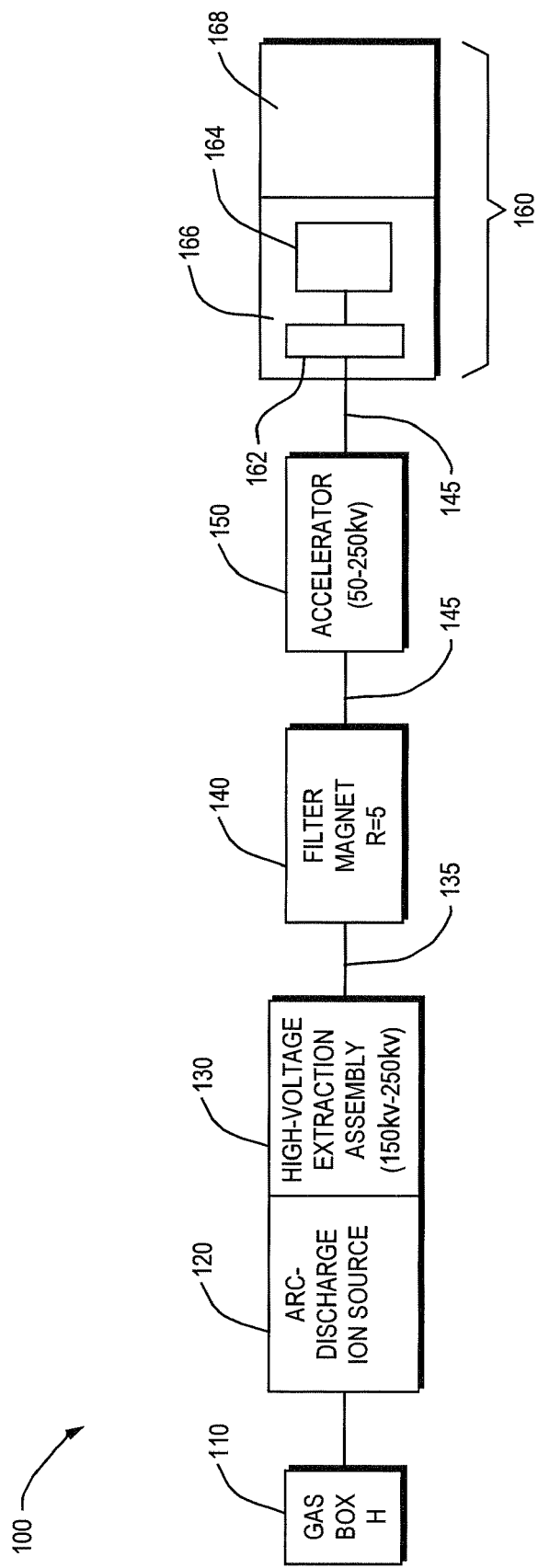
FIG. 1 is a block diagram of an inventive ion implanter, incorporating a low resolution mass analyzer, configured to implant hydrogen ions.

The invention relates to ion implanters useful for economically implanting semiconductor wafers preparatory to photovoltaic cell fabrication. Techniques for making semiconductor laminae for photovoltaic applications by cleaving after high-dose implantation of hydrogen or helium are described in co-owned U.S. application Ser. No. 12/057,265, Sivaram et al., "Method to Form a Photovoltaic Cell Comprising a Thin Lamina," the disclosure of which is incorporated herein by reference. Hydrogen, helium, or both are implanted in a wafer of semiconductor material, such as monocrystalline silicon, at a depth defining a cleave plane, which determines a lamina thickness. Removal of the lamina from the implanted wafer is effected by, for example, annealing the wafer to provoke exfoliation of the lamina at the cleave plane.

For preparation of efficient photovoltaic devices, lamina thicknesses of about 1 micron and greater are desirable. The location of the cleave plane is related to the depth at which implanted ions come to rest in the wafer, which is largely dependent on the terminal ion energy, or implant energy. Accordingly, an ion implanter useful for making laminae by this method preferably delivers an implant energy greater than 100 keV and more preferably encompassing implant energies between 100 keV and values such as 150 keV, 200 keV, 250 keV, or 300 keV, 400 keV, 500 keV or greater. The optimal implant dose is on the order of $10^{16}$ ions/cm$^2$ or more, or equal to or greater than $10^{17}$ ions/cm$^2$. These process parameters translate into high voltage demands and relatively high ion beam current and/or long process times, all of which contribute to noncompetitive economics for photovoltaics fabrication.

The invention exploits aspects of ion implantation particular to hydrogen and helium ions in constituting an instrument that can meet the process demands for implant energy and dose at practicable cost.

In one aspect, the implanters described herein in accordance with an illustrative embodiment are constituted so as to be less expensive to manufacture and maintain than conventional implanters. A first instance of this aspect pertains to the extraction assembly that impels ions out of the ion source. A high-current ion implanter may incorporate a high-voltage extraction assembly operable at an extraction voltage of 100 kV, 150 kV, 200 kV, or any value between 100 kV and about 250 kV. The extraction voltages used in accordance with the invention are workable with ion sources adapted to generate hydrogen or helium ions because these ions are not prone to deposit on the extraction apparatus walls, in contrast to many of the more frequently implanted elements. The high-voltage extraction apparatus realizes implant energies suitable for photovoltaics preparation without the expense of an additional accelerator. Alternatively, the illustrative implanter further incorporates an accelerator configured to apply an accelerating voltage, such as 50 kV, 100 kV, 150 kV, 200 kV, 250 kV or any voltage from 100 kV to 250 kV or more, augmenting the implant energy. In this case, implant energies up to 500 keV can be achieved without either of the extraction voltage or the accelerating voltage surpassing 250 kV, which would increase the cost of implanter construction.

Another instance of economical implanter construction pertains to the mass analyzer used to select hydrogen or helium ions from the extracted ions for implantation. A mass analyzer is characterized by its mass resolution R, defined by $R=m/\Delta m$, in which m is the full width at half maximum of a peak describing the ion beam current leaving he mass analyzer, as a function of ion mass m. A higher value of the mass resolution R indicates better discrimination between species. For typical semiconductor applications, the mass resolution is usually at least 15, in order to enable filtering of 11B+ from 10B+. Ion implanters typically use mass analyzers having mass resolution values much greater than 15, on the order of 50 or more, to minimize contamination of the implant by extraneous ions. In a variation, an ion implanter achieves a desired value of R by using multiple mass analyzers in series in place of a single mass analyzer. For example, the implanter is configured so that gross contamination is removed from the ion stream by a first mass analyzer of low R, after which the ions are passed to a second, higher-R analyzer that filters and directs the ions toward the wafers.

By contrast to conventional implanters, the invention may exploit the high spectral discrimination achievable by a low-R mass analyzer applied to filtering low-mass ions. Accordingly, an implanter of the invention may incorporate a mass analyzer having a mass resolution R no greater than ten, as low as 8, 6 or 4, without any more discriminating analyzer following. The relatively inexpensive low-R mass analyzer, i.e., the sole mass analyzer in the implanter, achieves the desired selection of hydrogen or helium at reduced cost compared to conventional implanters. Such a low-resolution dipole filter magnet is described, for example, in U.S. Pat. No. 6,130,436.

Optionally, the mass analyzer is characterized by a low magnetic rigidity Br, in which B is the magnetic field traversed by the selected ions and r is the radius of the selected ions' pathway through the magnetic field. Typically, the mass analyzer in a conventional implanter incorporates a modifiable exit slit and an electromagnet of variable field strength to enable adjustment of the magnetic rigidity, so that the implanter is configurable to implant any of a wide range of elements, with variable discrimination, electable by the user. A given configuration establishes a certain value of magnetic rigidity Br, at which the mass analyzer is capable of selecting any ion i conforming to the equation $$Br = (2E_i m_i / q_i)^{\frac{1}{2}}$$

in which $m_i$ is the mass of a selected ion i, $E_i$ is its energy, and $q_i$ is its charge.

By contrast, the ion implanter of the invention may incorporate a low-Br mass analyzer having a magnetic rigidity adjustable only up to a maximum value capable of selecting ions of interest for inclusion in the ion beam. In one embodiment, the maximum value of magnetic rigidity may correspond to selecting an ion having mass less than 2 Daltons and energy no greater than some upper bound. The upper bound may be, for example, between 50 keV and 300 keV, such as 250 keV, 200 keV, 150 keV or 90 keV, as appropriate for selecting hydrogen ions moving with energy corresponding to the highest extraction voltage to be applied during use of the implanter. In another embodiment, the maximum value of magnetic rigidity may correspond to selecting an ion having mass less than 5 Daltons and energy no greater than an upper bound as delineated above, extending the capability of the low-Br mass analyzer to the selection of extracted singly- or doubly-charged helium ions. Limiting the mass analyzer to relatively low values of Br eliminates unneeded adjustment capabilities, thereby lowering implanter construction cost.

Still another instance of the cost-effective implanter pertains to an endstation control system. An endstation in an ion implanter typically includes a process chamber in which the endstation control system is configured to control movement of an appliance, such as a disk or spoked wheel, supporting the wafers during implantation. To effect uniform dose coverage over the entire surface of each wafer and to manage the instantaneous heat load at a given location, the control system moves the disk relative to the ion beam irradiating the wafers. Specifically, the control system is configured to scan the disk perpendicular to the beam at several cm/s and to rotate the disk at several hundred rpm during implantation. In conventional ion implanters, the control system is configured optionally to introduce tilt or twist by varying the angle between the ion beam and the wafer during rotation. By contrast, the illustrative ion implanter described herein may incorporate an endstation control system configured to maintain a respective constant angle of from 0° up to about 10° between the ion beam and each of the wafer normals throughout implantation. Notably, the simplified endstation control system enables lower-cost implementation and maintenance of the implanter.

In another aspect, in order to economically deliver high implant energy values and doses, the illustrative implanters of the present invention are constituted for high throughput by delivering more ions per operating time and per batch loaded. To this end, the implanters may incorporate current sources capable of generating high-current ion beams, at least 5 mA, more preferably greater than 20 mA, as great as 30, 40, 60, 80 or 100 mA.

In one instance, enhanced implanter throughput pertains to the capacity of the endstation appliance. A typical appliance in a conventional implanter bears circular elastomeric pads supporting the wafers, arranged in an annulus around the center of the disk. Thirteen circular 20-cm wafers disposed about a central axis is a common layout in conventional implanters.

By contrast, the enhanced implanter may incorporate a high-capacity endstation, increasing the number of wafers implanted per run by a factor of two or more compared to conventional endstation configurations. In one embodiment, a disk is adapted to hold the wafers in multiple concentric annuli. In other embodiments, the larger-capacity disk is adapted especially to support noncircular wafer geometries, such as are used in solar cell preparation. In particular, such a disk bears pads shaped to support square wafers or 30 irregular-octagonal wafers (formed by clipping four corners from squares, for example 156 mm squares with corners clipped such that the diagonal dimension is 200 mm). The wafers may be arranged to enhance the fraction of time the ion beam strikes a wafer, versus striking interstices between wafers. Thus, in one embodiment, the square or corner-clipped-square pads are arranged in rows or columns. In another embodiment, the square or corner-clipped-square pads are disposed in a pseudo-close-packed arrangement with pad diagonals aligned with disk radii.

Another instance of enhanced implanter throughput pertains to the endstation control system. In a conventional implanter, the endstation control system typically moves the disk completely out of the ion beam before changing directions during cyclical scanning. Such scanning beyond the disk perimeter results in a uniform implant concentration profile along the disk radii. By contrast, the endstation control system in the illustrative enhanced implanter may be configured to move the disk so that the ion beam has turnaround points over the wafers. This feature reclaims the ions lost over the edge of the disk in conventional scanning, contributing to the productivity of the illustrative implanter.

The invention may incorporate any or several of these features in a low-cost ion implanter configured to make solar cells.

With reference to FIG. 1, in an illustrative embodiment, a high-current ion implanter 100 comprises an arc-discharge ion source 120 supplied with hydrogen through a single gas box 110, a high-voltage extraction assembly 130, a low-resolution dipole filter magnet 140, an accelerator 150, and an endstation 160.

The rate at which the arc-discharge ion source 120 can generate ions determines the upper limit of the ion beam current attainable by the ion implanter 100.

The high-voltage extraction assembly 130 comprises parallel plates and a voltage source configured to apply an extraction voltage, adjustable over a range from 150 kV to 250 kV, across the plates. The extraction voltage is disposed to electrostatically impel ions through an opening such as a slit or hole in the plates and steer them toward the dipole filter magnet 140 in an extracted beam 135. The opening is adjustable to modify the origin and direction of the extracted beam 135 for optimal cooperation with the dipole filter magnet 140.

The dipole filter magnet 140 has mass resolution R=5 and is configured to sort ions in the extracted beam 135 according to their respective mass/charge ratios, thereby to select hydrogen ions for implantation. The filter magnet 140 comprises an exit slit adjustable to transmit only singly-charged hydrogen ions moving with energy corresponding to the extraction voltage, or ions having an equivalent magnetic rigidity, out of the filter magnet 140 in an ion beam 145 directed toward the endstation 160.

The accelerator 150 is configured to apply an accelerating voltage, adjustable over a range from 50 kV to 250 kV, between the dipole filter magnet 140 and the endstation 160, bringing ions in the ion beam 145 to a desired terminal ion energy, or implant energy, before they reach the endstation 160.

Figure 2:
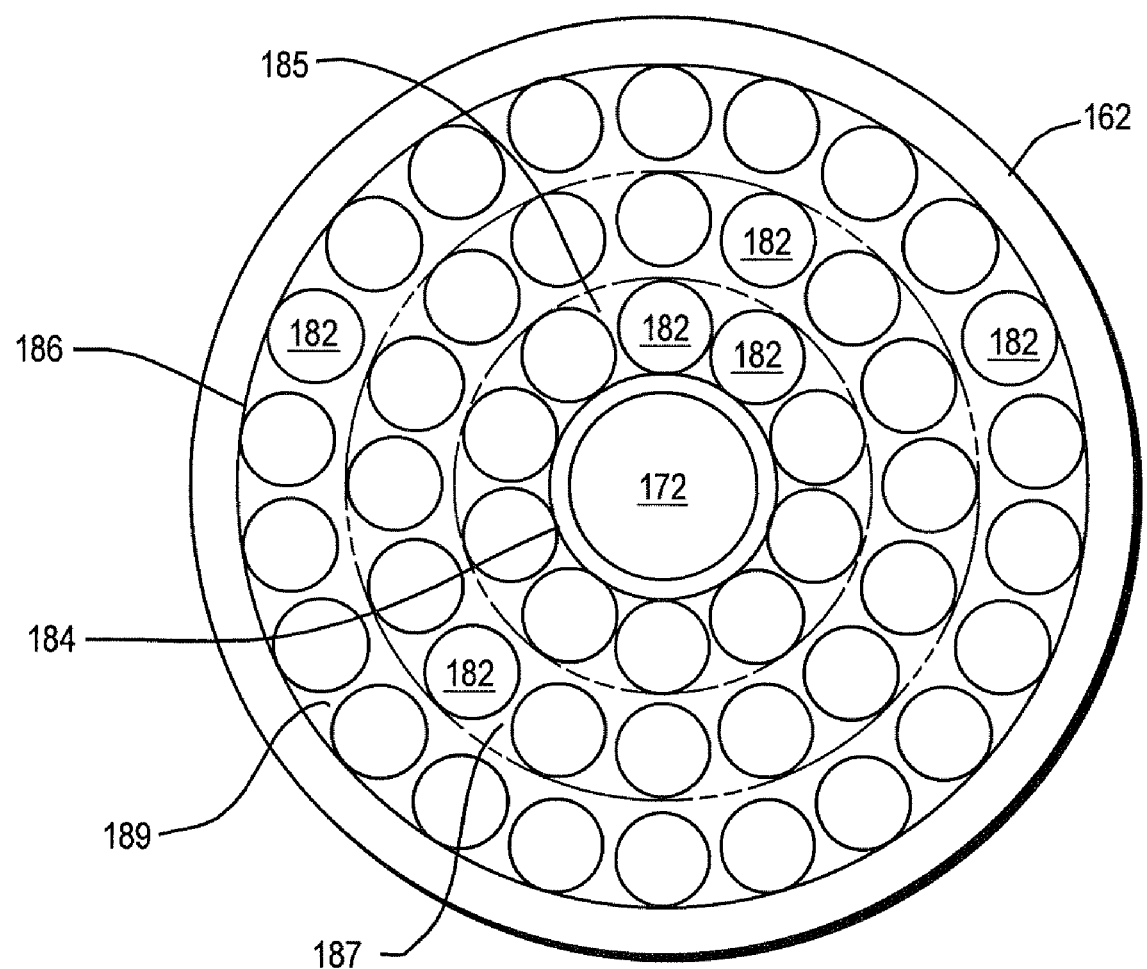
FIG. 2 is a projection showing the face of a disk, compatible with the invention, holding wafers in concentric annuli.

In the endstation 160, a high-capacity, small-angle-cone disk 162 is transferable from staging area 168 to a process chamber 166 for engagement with a control system 164. The control system 164 is configured to scan the disk 162 cyclically so that the ion beam 145 repeatedly traces a path having turnaround points on the wafers while rotating the disk 162 about its axis. With reference to FIG. 2, the illustrative disk 162 has a central axis 172 around which pads 182 are disposed in a first annulus 185, a second annulus 187, and a third annulus 189. The first annulus 185 is bounded at its inner edge by a first circle 184 intersecting the wafer edge closest to the axis 172. No wafer material lies inside the first circle 184. The third annulus 189 is bounded at its outer edge by a second circle 186 circumscribing the pads 182 and intersecting the wafer edge furthest from the axis 172. No wafer material lies outside the second circle 186. The contour of the face of the high-capacity disk 162 is a small-angle cone so that the pads 182 slope toward the axis 172. The implanter 100 is illustratively configured so that, during implantation, the center of the ion beam 145 traces a radius of the disk 162, changing direction over the first 184 and second 186 circles.

Referring to FIG. 1, in an exemplary procedure using the implanter 100 to prepare laminae from silicon wafers, the pads 182 on disk 162 are each loaded with a monocrystalline silicon wafer, and the disk 162 is positioned in the process chamber 166. The process chamber 166 is pumped to low pressure, on the order of $10^{-4}$ Torr. The control system 164 rotates the disk 162 about the axis 172 at 785 rpm, the rotation forcing the wafers against the pads 182 with a force proportional to the square of the rotation rate. The compressive force promotes thermal contact between a wafer and its supporting pad 182, increasing the rate of heat removal from the wafer during implantation.

Simultaneously, the control system 164 scans the disk 162 at 2-10 cm/s in a direction perpendicular to the axis 172. The control system 164 scans the disk 162 cyclically such that the disk 162 does not move out of the path of the ion beam 145 during implantation. The turnaround points of the scan are over the wafers.

The arc-discharge ion source 120 is activated to generate hydrogen ions. The high-voltage extraction assembly 130 is operated to apply an extraction voltage of, e.g., 150 kV, impelling ions from the ion source. The extracted beam 135 enters the dipole filter magnet 140. Ions in the extracted beam 135 passing through the magnetic field of the dipole electromagnet are deflected according to their respective magnetic rigidities, splaying the extracted beam 135 into components. The component of interest, hydrogen ions, is transmitted through the exit slit of the filter magnet 140 toward the endstation 160 in an ion beam 145. The ion beam 145 leaving the dipole filter magnet 140 illustratively constitutes a 60 mA current of hydrogen ions.

The accelerator 150 is operated to apply an accelerating voltage of, e.g., 150 kV, which propels hydrogen ions in the ion beam 145 toward the endstation 160, to an implant energy of about 300 keV.

The ion beam 145 irradiates the wafers disposed on the disk 162 until the time integral of the current of the ion beam 145 illustratively corresponds to a dose of, e.g., $7 \times 10^{16}$ ions/cm$^2$, the implanted hydrogen ions defining cleave planes in respective wafers. The implanted wafers are removed from the ion implanter 100 and annealed to effect cleaving of laminae from the wafers at the cleave planes. The laminae are about 3.0 μm thick. The laminae are suitable for making photovoltaic devices by further processing, as described in Srinivasan et al., earlier incorporated by reference.

Figure 3:
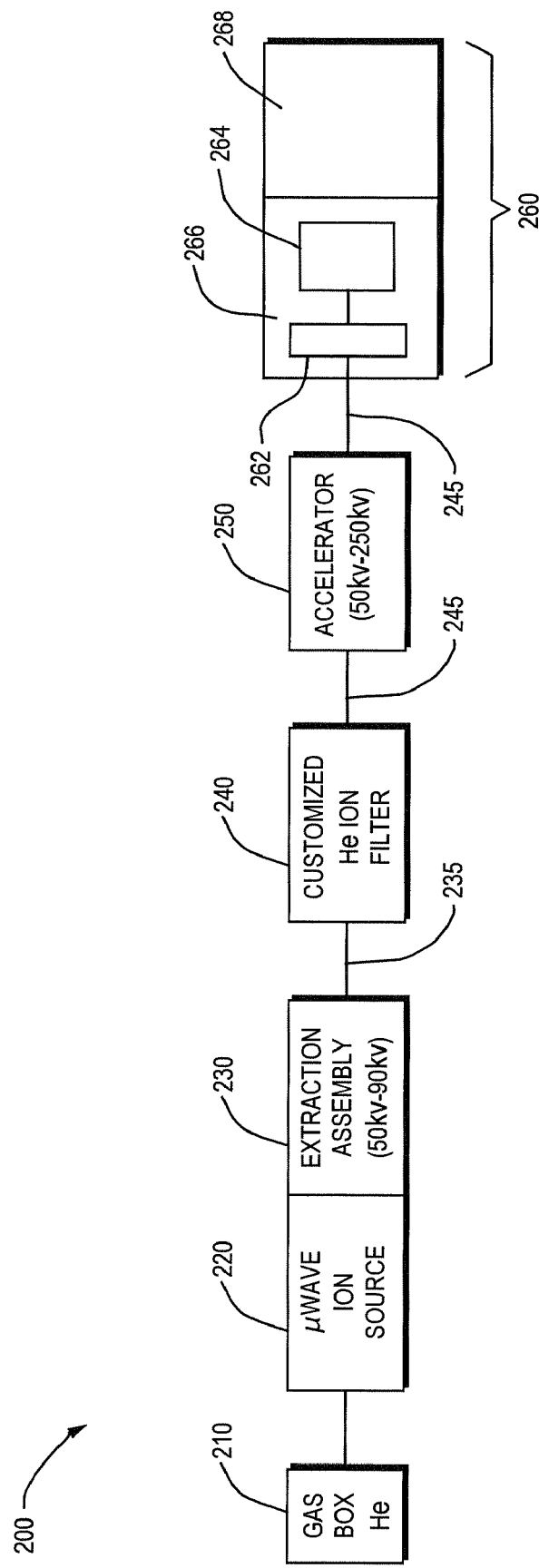
FIG. 3 is a block diagram of an inventive ion implanter incorporating a customized helium ion filter magnet.

With reference to FIG. 3, in another illustrative embodiment, an ion implanter 200 comprises a microwave ion source 220 supplied with helium from a single gas box 210, an extraction assembly 230, a customized helium ion filter 240, an accelerator 250, and an endstation 260.

The microwave ion source 220 is operable at, e.g., 2.45 GHz to apply microwave radiation to helium gas. The extraction assembly 230 comprises parallel plates and a voltage source configured to apply an extraction voltage, illustratively adjustable from 50 kV to 90 kV, across the plates. The extraction voltage is disposed to electrostatically impel ions through a slit or hole in the plates and steer them toward the customized helium ion filter 240 in an extracted beam 235.

The customized helium ion filter 240 is configured to sort ions in the extracted beam according to their respective mass/charge ratios in order to select helium ions from the extracted beam 235 for implantation. The customized helium filter 240 has a magnetic rigidity not adjustable to exceed a customized value corresponding to selecting singly-charged helium ions moving with 90 keV.

The accelerator 250 is configured to apply an accelerating voltage, illustratively adjustable from 50 kV to 250 kV, between the customized helium ion filter 240 and the endstation 260, bringing helium ions in the ion beam 245 to an implant energy before implantation.

Figure 4:
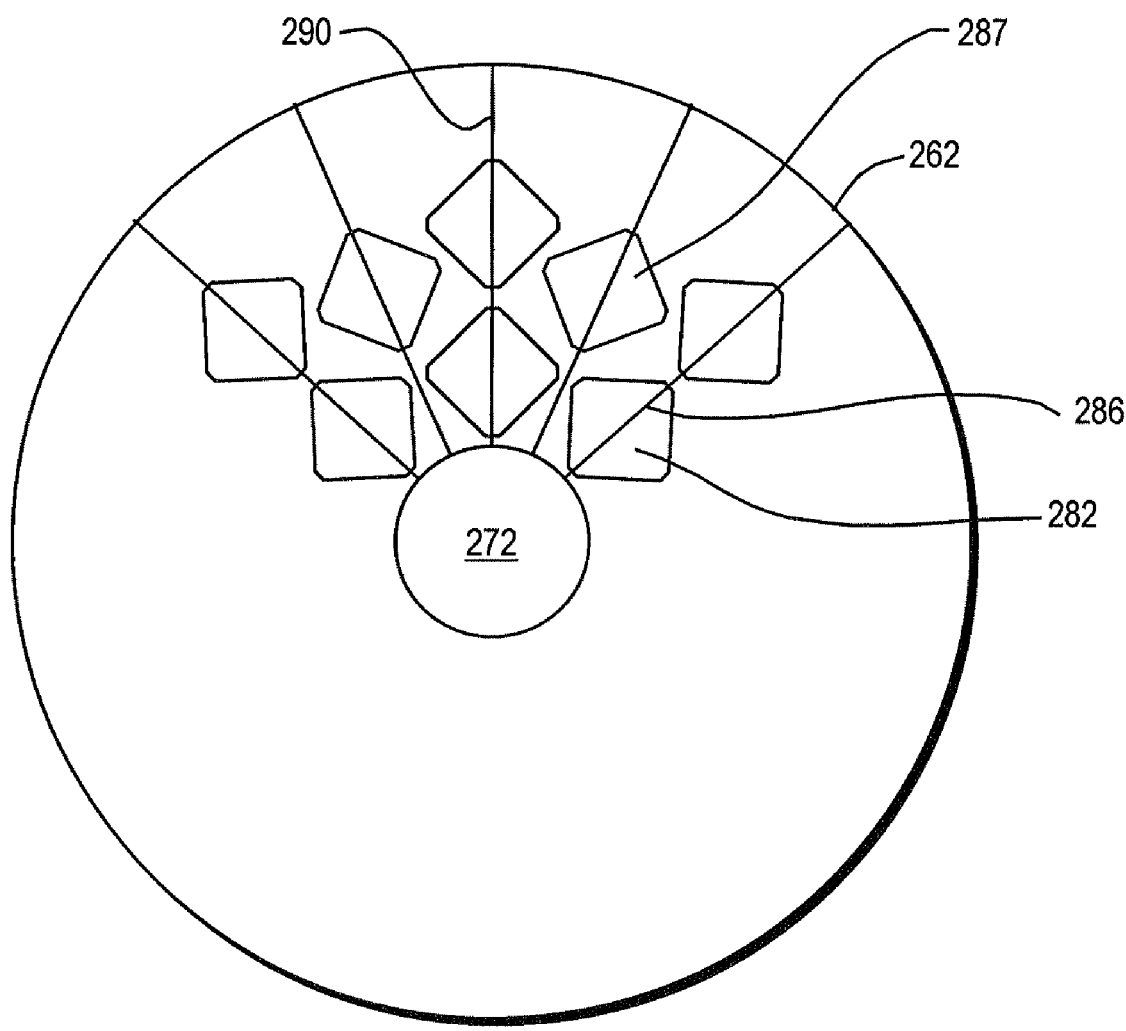
FIG. 4 is a projection showing the face of a disk, compatible with the invention, holding corner-clipped-square wafers in a pseudo-close-packed arrangement.

In the endstation 260, a disk 262 is transferable to a process chamber 266 from an in-air staging area 268. In the process chamber 266, the disk 262 engages a control system 264. With reference to FIG. 4, the disk 262 has a central axis 272 and bears corner-clipped-square elastomeric pads 282 disposed in a pseudo-close-packed arrangement with pad diagonals 286 aligned with disk radii 290. The contour of the face of the disk 262 is a small-angle cone so that the pads 282 slope toward the axis 272.

Referring to FIG. 3, in an exemplary procedure using the implanter 200 to prepare laminae from silicon wafers, corner-clipped square monocrystalline silicon wafers are loaded onto the pads 282 of the disk 262, and the disk 262 is positioned in the process chamber 266. The process chamber 266 is pumped to low pressure, on the order of $10^{-4}$ Torr. The control system 264 scans the disk 262 perpendicular to the axis 272 at, e.g., 2 to 10 cm/s and illustratively rotates the disk 262 about its axis 272 at 785 rpm while maintaining a respective constant 7° angle between the axis 272 and each of the wafer normals. As the disk 162 rotates, each wafer is pushed against its supporting pad 282 by a force proportional to the square of the rotation rate. The compressive force promotes heat removal from the wafer through its respective pad 282.

The microwave ion source 220 is activated to generate helium ions. The extraction assembly 230 is illustratively operated to apply an extraction voltage of 90 kV. Ions leave the ion source 220 in the extracted beam 235 and enter the customized helium ion filter 240. Ions pass through a magnetic field in the customized helium ion filter 240 and are thereby deflected according to their respective magnetic rigidities. The filter 240 is operated to permit helium ions to leave in the ion beam 245 directed toward the endstation 260. The ion beam 245 illustratively constitutes a 20 mA current of helium ions.

The accelerator 250 is operated to apply an accelerating voltage of, e.g., 210 kV, bringing the helium ions to an implant energy of about 300 keV before they reach the endstation 260. The ion beam 245 strikes the wafers disposed on the disk 262 to implant helium ions in the silicon wafers to a dose of, e.g., $6 \times 10^{16}$ ions/cm$^2$, defining cleave planes in respective wafers. The implanted wafers are removed from the ion implanter 200 and annealed to exfoliate of laminae from the wafers at respective cleave planes. The laminae are about 1.4 μm thick.

In a related embodiment, the ion source 220 generates hydrogen ions and a customized ion filter having a magnetic rigidity not adjustable to exceed a customized value corresponding to selecting hydrogen ions moving with 90 keV serves as mass analyzer. The implanter 200 is operated to implant hydrogen at an implant energy and dose defining cleave planes in the wafers.

Figure 5:
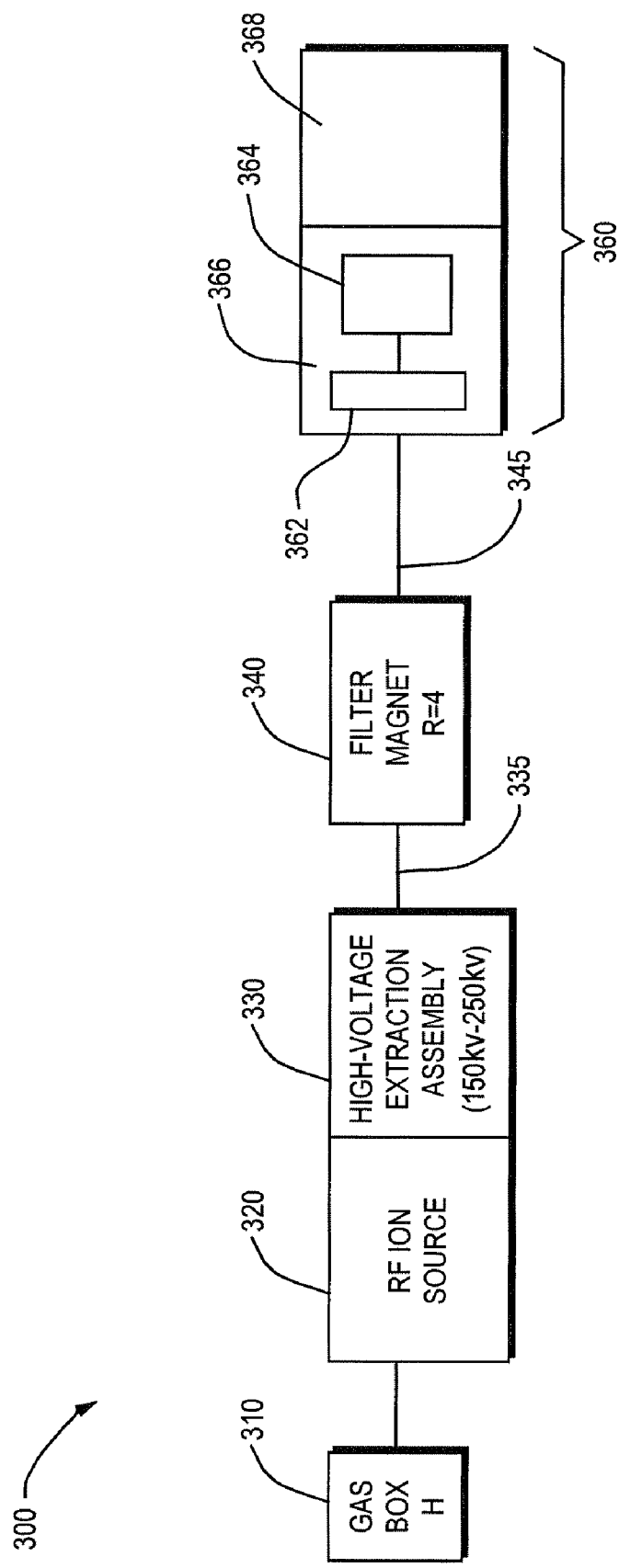
FIG. 5 is a block diagram of an inventive ion implanter incorporating a high-voltage extraction assembly.

With reference to FIG. 5, in yet another illustrative embodiment, a high-current ion implanter 300 comprises a rf ion source 320 supplied with hydrogen through a single gas box 310, a high-voltage extraction assembly 330, a low-resolution dipole filter magnet 340, and an endstation 360.

The rf ion source 320 is inductively coupled to hydrogen gas and operable at 13.56 MHz to sustain a plasma. The high-voltage extraction assembly 330 comprises plates and a voltage source configured to apply an extraction voltage, adjustable over a range from 150 kV to 250 kV, to the plates. The extraction voltage is disposed to impel ions electrostatically out of the ion source 320 through an opening in the plates and steer them toward the dipole filter magnet 340. The opening is adjustable to modify the origin and direction of the extracted beam 335 for optimal entry into the dipole filter magnet 340.

Figure 6:
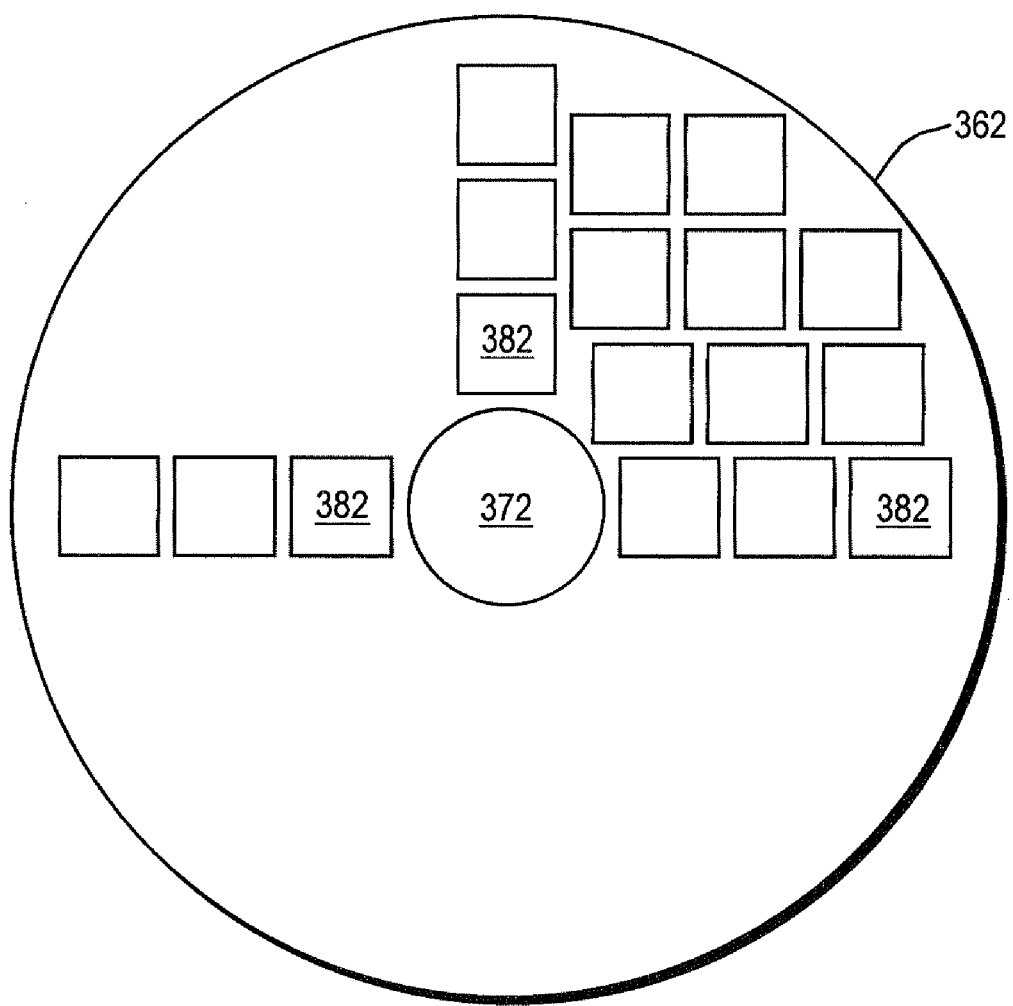
FIG. 6 is a projection showing the face of a disk, compatible with the invention, holding square wafers in rows and columns.

The dipole filter magnet 340 has mass resolution R=4 and is configured to sort ions in the extracted beam 335 according to their respective magnetic rigidities and to select hydrogen ions moving with energy corresponding to the extraction voltage, or ions having the equivalent magnetic rigidity, and direct them toward the endstation 360 in an ion beam 345. In the endstation 360, a high-capacity, small-angle-cone disk 362 is transferable from staging area 368 to a process chamber 366 for engagement with a control system 364. With reference to FIG. 6, the illustrative disk 362 has a central axis 372 and bears square elastomeric pads arranged in rows and columns.

Referring to FIG. 5, in an exemplary procedure using the implanter 300 to prepare laminae from silicon wafers, the pads 382 on disk 362 are each loaded with a square silicon wafer, and the disk 362 is positioned in the process chamber 366. The process chamber 366 is pumped to low pressure, on the order of $10^{-4}$ Torr. The control system 364 rotates the disk 362, forcing the wafers against the pads 382, while scanning the disk 362 cyclically.

The rf ion source 320 is activated to generate hydrogen ions. The high-voltage extraction assembly 330 is operated to apply an extraction voltage of, e.g., 200 kV, which corresponds to the implant energy. Ions leave the ion source 320 in the extracted beam 335 and enter the dipole filter magnet 340.

In the dipole filter magnet 340 ions pass through a magnetic field and are thereby deflected according to their respective magnetic rigidities. Hydrogen ions from the extracted beam 335 are selected and directed toward the endstation 360. The ion beam 345 leaving the dipole filter magnet 340 illustratively constitutes a 40 mA current of hydrogen ions.

The ion beam 345 strikes the wafers disposed on the disk 326, implanting hydrogen ions in the silicon wafers to a dose of, e.g., $5 \times 10^{16}$ ions/cm$^2$, defining cleave planes in respective wafers. The implanted wafers are removed from the ion implanter 300 and annealed to effect cleaving of laminae from the wafer at respective cleave planes. The laminae are about 1.8 µm thick.

In a variation on the procedures, wafers are implanted with both hydrogen and helium. Each of the dual implants may be carried out consecutively, under appropriate respective process parameters, in one implanter. Or, the implantation of hydrogen and of helium may each be done in a separate ion implanter.

Although specific features of the invention are included in some embodiments and not in others, it should be noted that each feature may be combinable with any or all of the other features in accordance with the invention.

It will therefore be seen that the foregoing represents a highly advantageous and cost-effective approach to providing ion implanters for implanting at process currents and implant energies compatible with economical preparation of semiconductor laminae for solar cell fabrication. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. An ion implanter adapted to implant ions in semiconductor wafers, comprising:
   a. an appliance configured to hold the wafers;
   b. an ion source configured to generate ions at a rate;
   c. a mass analyzer, having a resolving power less than ten, configured to sort the ions according to their respective mass/charge ratios and further configured to direct selected ions toward the appliance in an ion beam; and
   d. voltage apparatus configured to apply a voltage drop of at least 250 kV between the ion source and the appliance, and further configured to propel ions toward the appliance, wherein the rate enables the selected ions to constitute a current of at least 20 mA in the ion beam, the mass analyzer is the only mass analyzer in the ion implanter, and the ion implanter is operable to implant ions in the wafers at a depth defining respective cleave planes at which respective laminae cleave from the wafers upon annealing, the laminae being at least 2 µm thick and suitable for fabricating a photovoltaic device.

2. The ion implanter of claim 1 wherein the selected ions are hydrogen ions.

3. The ion implanter of claim 1 wherein the selected ions are helium ions.

4. The ion implanter of claim 1 wherein the mass analyzer has a maximum magnetic rigidity corresponding to selecting a singly-charged ion of mass less than 5 Daltons and energy no greater than 100 keV.

5. The ion implanter of claim 1 wherein the mass analyzer has a maximum magnetic rigidity corresponding to selecting a singly-charged ion of mass less than 2 Daltons and energy no greater than 100 keV.

6. The ion implanter of claim 1 wherein the voltage drop is at least 300 kV.

7. The ion implanter of claim 1 wherein the voltage drop is at least 400 kV.

8. The ion implanter of claim 1 wherein the current is at least 40 mA.

9. An ion implanter adapted to implant ions in semiconductor wafers, comprising:
   a. an appliance configured to hold the wafers;
   b. an ion source configured to generate ions of a particular species at a rate, the particular species being hydrogen or helium;
   c. voltage apparatus applying a voltage drop between the ion source and the appliance, configured to accelerate ions toward the appliance, the voltage drop comprising an extraction voltage drop, not adjustable above a maximum extraction value, configured to extract ions from the ion source; and
   d. a mass analyzer, configured to sort ions extracted from the ion source according to their respective mass/charge ratios and further configured to direct selected ions of the particular species toward the appliance in an ion beam, the mass analyzer having a maximum magnetic rigidity corresponding to selecting ions of the particular species having respective energies corresponding to the maximum extraction value, wherein the rate enables the selected ions of the particular species to constitute a current of at least 5 mA in the ion beam, and the ion implanter is operable to implant ions in the wafers at a depth defining respective cleave planes at which respective laminae cleave from the wafers upon annealing, the laminae being at least 2 µm thick and suitable for fabricating a photovoltaic device.

10. The ion implanter of claim 9 wherein the voltage drop is at least 250 kV.

11. The ion implanter of claim 9 wherein the voltage drop is at least 400 kV.

12. The ion implanter of claim 9 wherein the maximum extraction value is no greater than about 150 kV.

13. The ion implanter of claim 9 wherein the current is greater than 20 mA.

14. The ion implanter of claim 9 wherein the current is greater than 40 mA.

15. The ion implanter of claim 9 wherein the mass analyzer has a resolving power less than ten and is the only mass analyzer in the ion implanter.

16. A method of making a lamina for fabricating a photovoltaic device, the method comprising:
   providing a semiconductor wafer;
   configuring an appliance to hold the wafer;
   configuring an ion source to generate ions of a first species, the first species being hydrogen or helium;
   configuring a mass analyzer to sort ions from the ion source according to their respective mass/charge ratios and to direct selected ions toward the appliance in an ion beam;
   configuring a voltage apparatus to apply a voltage drop between the ion source and the appliance;
   installing the semiconductor wafer in the appliance;
   operating the ion source, mass analyzer and voltage apparatus to generate, select, and accelerate ions of the first species toward the appliance in a first ion beam, the selected ions of the first species constituting a first current of at least 20 mA in the first ion beam, thereby implanting the ions of the first species in the wafer at a depth defining a cleave plane; and annealing the wafer to effect cleaving of a lamina from the wafer at the cleave plane, the lamina being at least 2 μm thick and suitable for fabricating a photovoltaic device.

17. The method of claim 16 wherein the first species is hydrogen and further comprising, before annealing the wafer, generating, selecting and accelerating helium ions toward the wafer in a second ion beam, the selected helium ions constituting a second current of at least 20 mA in the second ion beam, thereby implanting the helium ions in the wafer.

18. The method of claim 16 wherein the mass analyzer has a resolving power less than ten and the ions of the first species pass through no mass analyzer besides the mass analyzer.

19. The method of claim 18 wherein the mass analyzer has a maximum magnetic rigidity corresponding to selecting a singly-charged ion of mass less than 5 Daltons and energy no greater than 100 keV.

20. The method of claim 16 wherein the voltage drop comprises an extraction voltage drop, not adjustable above a maximum extraction value, extracting ions from the ion source and the mass analyzer has a maximum magnetic rigidity corresponding to selecting ions of the first species having respective energies corresponding to the maximum extraction value.

21. The method of claim 20 wherein the maximum extraction value is no greater than about 150 kV.

22. The method of claim 16 wherein the current is greater than 40 mA.

23. The method of claim 16 further comprising fabricating a photovoltaic device from the lamina.

24. The method of claim 16 wherein the ion source applies electromagnetic radiation having frequency 2 to 10 GHz to a gas.

25. The method of claim 16 wherein the ion source delivers energy having a frequency of 100 kHz to 27 MHz, sustaining a plasma.

26. The method of claim 16 wherein the lamina has a thickness of at least 4 μm.

27. The method of claim 16 wherein the wafer is monocrystalline silicon.

28. The method of claim 16 wherein operating the ion source, mass analyzer and voltage apparatus implants the ions of the first species to a dose of at least $10^{16}$ ions/cm$^2$.

29. The method of claim 16 wherein the voltage drop is at least 300 kV.

* * * * *